United States Patent
Wölfel (10) Patent No.: US 11,395,411 B2
(45) Date of Patent: Jul. 19, 2022

(54) METHOD FOR PRODUCING A PRINTED CIRCUIT BOARD USING A MOULD FOR CONDUCTOR ELEMENTS

(71) Applicant: JUMATECH GMBH, Eckental (DE)

(72) Inventor: Markus Wölfel, Eckental (DE)

(73) Assignee: JUMATECH GMBH

( * ) Notice: Subject to any disclaimer, the term of this patent is extended or adjusted under 35 U.S.C. 154(b) by 0 days.

(21) Appl. No.: 16/980,097

(22) PCT Filed: Mar. 11, 2019

(86) PCT No.: PCT/EP2019/055991
§ 371 (c)(1),
(2) Date: Sep. 11, 2020

(87) PCT Pub. No.: WO2019/175090
PCT Pub. Date: Sep. 19, 2019

(65) Prior Publication Data
US 2021/0029831 A1    Jan. 28, 2021

(30) Foreign Application Priority Data

Mar. 12, 2018 (DE) ...................... 10 2018 203 715.9
Oct. 22, 2018 (DE) ...................... 20 2018 106 030.9

(51) Int. Cl.
*H05K 3/10*    (2006.01)
*H05K 1/18*    (2006.01)
*H05K 3/32*    (2006.01)

(52) U.S. Cl.
CPC ............ *H05K 3/103* (2013.01); *H05K 1/188* (2013.01); *H05K 3/328* (2013.01); *H05K 2201/10022* (2013.01); *H05K 2203/0278* (2013.01)

(58) Field of Classification Search
CPC ........ H05K 3/103; H05K 3/328; H05K 3/107; H05K 2203/0278; H05K 2203/0156;
(Continued)

(56) References Cited

U.S. PATENT DOCUMENTS 5,459,639 A    10/1995  Izumi
6,323,549 B1 *  11/2001  deRochemont ...... H05K 1/0207
                                                   257/703
(Continued)

FOREIGN PATENT DOCUMENTS

DE    102013223143 A1    5/2015
EP    1 842 402 A2    10/2007
(Continued)

OTHER PUBLICATIONS

International Search Report issued in PCT/EP2019/055991 (in English and German), dated Jul. 9, 2019; ISA/EP.
(Continued)

*Primary Examiner* — Donghai D Nguyen
(74) *Attorney, Agent, or Firm* — Harness, Dickey & Pierce, P.L.C.

(57) ABSTRACT

A method is provided for producing a printed circuit board including at least one conductor element, which extends between connection points in the printed circuit board. In order to increase the productivity of a known method for producing a printed circuit board including at least one conductor element, which extends between connection points in the printed circuit board, the method comprises the following steps: Step A: providing a mold having at least one receptacle for a conductor element; Step B: arranging a conductor element in the receptacle of the mold; Step C: connecting the conductor element arranged in the receptacle of the mold to an electrically conductive sheetlike element at positions of the intended connection points; Step D:
(Continued)

embedding the conductor element, which is connected to the electrically conductive sheetlike element, into insulating material; and Step E: working out the connection points from the electrically conductive sheetlike element.

6 Claims, 5 Drawing Sheets

(58) Field of Classification Search
CPC .. H05K 1/188; H05K 2201/1028; G01R 3/00; Y10T 29/49147; Y10T 29/49158
USPC .......................................... 29/832, 842, 848
See application file for complete search history.

(56) References Cited

U.S. PATENT DOCUMENTS

| | | | | |
|---|---|---|---|---|
| 9,105,375 | B2 * | 8/2015 | Sugiyama | H01R 9/034 |
| 10,453,587 | B2 * | 10/2019 | Wakamori | H05K 3/20 |
| 2014/0158414 | A1 | 6/2014 | Baldwin et al. | |
| 2016/0282389 | A1 | 9/2016 | Wolfel | |

FOREIGN PATENT DOCUMENTS

| | | |
|---|---|---|
| JP | S50-034224 B1 | 11/1975 |
| JP | 2016-540379 A | 4/2016 |
| KR | 1995-0003232 A | 2/1995 |

OTHER PUBLICATIONS

Japanese Office Action for corresponding Japanese Application No. 2020-548764, dated Dec. 3, 2021 with English translation (21 Pages).

Korean Office Action for corresponding Korean Application No. 10-2020-7029175, dated Sep. 9, 2021 with English translation (11 Pages).

* cited by examiner

METHOD FOR PRODUCING A PRINTED CIRCUIT BOARD USING A MOULD FOR CONDUCTOR ELEMENTS

CROSS REFERENCE TO RELATED APPLICATIONS

This application is a U.S. National Phase Application under 35 U.S.C. 371 of International Application No. PCT/EP2019/055991 filed on Mar. 11, 2019, which claims the benefit of priority from German Patent Application Nos. 10 2018 203 715.9 filed Mar. 12, 2018 and 20 2018 106 030.9 filed on Oct. 22, 2018. The entire disclosures of all of the above applications are incorporated herein by reference.

BACKGROUND

Technical Field

The present invention relates to a method for producing a printed circuit board including at least one conductor element which extends between connection points in the printed circuit board.

Related Art

A method of this type is known from EP 1 842 402 A2.

With the known method, a conductor wire is welded to a copper foil and then pressed with insulating material.

In view of the manufacturing precision demands to be met today, the positions and orientations of the conductor elements and connection points must be measured precisely. In particular when printed circuit boards of the type in question are produced in mass production processes, the production process is delayed through repeated measurement procedures, whereby the productivity of the process is reduced.

Taking these considerations as a basis, it is the object of the present invention to increase the productivity of the known method.

SUMMARY

This object is achieved by a method according to aspect 1.

The here disclosed method for producing a printed circuit board including at least one conductor element, which extends between connection points in the printed circuit board, comprises the following steps:

Step A: providing a mold having at least one receptacle for a conductor element.
Step B: arranging a conductor element in the receptacle of the mold.
Step C: connecting the conductor element arranged in the receptacle of the mold to an electrically conductive sheetlike element at positions of the intended connection points.
Step D: embedding the conductor element, which is connected to the electrically conductive sheetlike element, into insulating material.
Step E: working out the connection points from the electrically conductive sheetlike element.

The use of the mold allows to precisely determine the relative orientation of a plurality of conductor elements, since the arrangement and the orientation of the receptacles relative to one another in the mold is precisely defined. Deviating from the conventional method, it is not necessary to separately measure the individual conductor elements for connection to the electrically conductive sheetlike element, but it will suffice to position them in the respective receptacles provided. Then, it will only be necessary to fix the electrically conductive sheetlike element relative to the mold, so that also the positions of all the conductor elements and connection points will be defined precisely in relation to the electrically conductive sheetlike element. Since the connection of the conductor elements with the electrically conductive sheetlike element is established in a condition in which the conductor elements are located in the mold, movements of the conductor elements relative to one another are impossible. Due to the fact that the individual measurement procedures for establishing the connection between the conductor elements and the electrically conductive sheetlike element can be dispensed with, the productivity of the method for producing the printed circuit board including at least one conductor element, which extends between connection points, can be increased significantly.

It may be of advantage when step A comprises at least one of the following substeps:

Substep A1: providing a mold having a preferably planar first side and at least one receptacle for a conductor element, the receptacle opening towards the first side of the mold.
Substep A2: arranging the mold such that the first side of the mold extends, at least sectionwise or completely, in a horizontal plane.

The horizontal orientation of the mold in substeps A1/A2 facilitates the positioning of the conductor element in the receptacle of the mold as well as the subsequent processing steps.

It may, however, also make sense when step B comprises at least one of the following substeps:

Substep B1: providing a conductor element having at least two connector sections, which are preferably arranged on and/or attached to the same side and/or different ends of the conductor element.
Substep B2: arranging the conductor element in the receptacle such that, relative to the plane in which the mold extends, the conductor element is accommodated in the receptacle preferably in a form-fit manner and/or without any play, the conductor element being preferably oriented parallel to the plane in which the mold extends.
Substep B3: arranging the conductor element in the receptacle such that the side of the conductor element provided with the connector sections is flush with the first side of the mold and the connector sections project beyond the first side of the mold.
Substep B4: arranging insulating material, preferably of an insulating-material sheetlike element, which preferably has openings that are adapted to the positions and, possibly, shapes of the connector sections, on the first side of the mold preferably such that a second side of the insulating-material sheetlike element rests areally on the first side of the mold as well as on the first side of the conductor element accommodated in the receptacle of the mold, with the upper side of the connector sections being, particularly preferred, flush with a first side of the insulating-material sheetlike element.

Substep B1 facilitates the connection of the conductor element with the electrically conductive sheetlike element. In particular, it turns out to be useful, when the side of the conductor element to which the connector sections are attached is planar. This can be achieved e.g. when the conductor element is a rectangular wire taken, by way of example, from a coil and cut to an appropriate length. Due to the previous winding on the coil, the rectangular wire may possibly not extend exactly along a straight line. By applying a pulling force to both ends, the conductor element can be straightened. Other techniques for straightening the conductor element may be used as well.

The connector sections are e.g. platelets of silver or some other suitable connecting material that is able to establish a permanent electrically conductive connection between the conductor element and the electrically conductive sheetlike element. Alternatively, the connector sections may also consist of an electrically non-conductive connecting material that is able to establish a permanent, purely mechanical connection between the conductor element and the electrically conductive sheetlike element. To this end, the connecting material may be weldable.

When the connector sections have been applied, the conductor element can be drawn to a suitable length and given a suitable shape that preferably fits precisely into a respective receptacle in the mold.

Substep B2 is advantageous as regards the fixing of the relative positions and the orientation of the conductor elements relative to one another in the plane in which the mold extends, since the conductor elements are prevented from moving in their respective receptacles.

Substep B3 allows the conductor elements to be also positioned in a direction perpendicular to the plane in which the mold extends.

Substep B4 proves to be useful for fully embedding the conductor element into insulating material. The conventional method proves to be problematic insofar as, after the conductor element has been connected to the electrically conductive sheetlike element, insulating material has to be pressed into the gap. This gap is difficult to access, when the connection between the conductor element and the electrically conductive sheetlike element has been established. In substep B4, e.g. a prepreg mat with prefabricated openings may be positioned at the positions of the connector sections such that its lower side rests areally on the upper side of the mold and on the upper side of the conductor element, while the connector sections lie flush with the upper side of the prepreg mat in one plane. In this case, each of the openings of the prepreg mat defines a form, which prevents unhindered spreading of the material of the connector section accommodated therein during the subsequent welding process. Unintentional contacting between the conductor element and the electrically conductive sheetlike element outside of the positions of the intended connection points can thus additionally be prevented. Preferably, a prefabricated insulating-material sheetlike element is used, so that the insulating-material sheetlike element need not be adapted individually and the productivity of the method can be increased still further. The openings may be punched making use of a mask, by way of example.

It may, however, also be useful when step C comprises at least one of the following substeps:

Substep C0: connecting the conductor element arranged in the receptacle of the mold to the electrically conductive sheetlike element via at least one connector section consisting of a non-electrically conductive, preferably weldable material, preferably by means of pressure welding.

Substep C1: arranging an electrically conductive sheetlike element on the first side of the mold, preferably on the first side of the insulating-material sheetlike element, more preferably such that the electrically conductive sheetlike element rests areally on the first side of the insulating-material sheetlike element and/or areally on the connector sections.

Substep C2: arranging a first electrode of a connection tool, which is used for establishing an electrically conductive connection between the conductor element and the electrically conductive sheetlike element, on a first side of the mold, preferably such that the first electrode is in contact with the first side of the electrically conductive sheetlike element.

Substep C3: arranging a second electrode of the connection tool, which is used for establishing an electrically conductive connection between the conductor element and the electrically conductive sheetlike element, on a second side of the mold, preferably such that the second electrode penetrates an opening in the mold and is in contact with the second side of the conductor element.

Substep C4: applying a contact pressure between the first electrode and the second electrode.

Substep C5: applying an electric current between the first electrode and the second electrode.

Substep C6: heating the connector section until the necessary working temperature has been reached, so that the conductor element and the electrically conductive sheetlike element will be connected inseparably via the connector section, preferably under the action of a force between the electrodes, by melting and solidifying the material of the connector section, by diffusion or in solid phase, preferably by welding.

Substep C7: removing the first electrode from the first side of the electrically conductive sheetlike element.

Substep C8: removing the second electrode from the second side of the conductor element and removing the second electrode from the opening in the mold.

Substep C9: applying at least one reference mark to the electrically conductive sheetlike element, preferably by producing at least one opening.

By means of substep C0 a permanent, purely mechanical connection can be established between the conductor element and the electrically conductive sheetlike element.

Substep C1 is advantageous with respect to the planar and uniform layer structure of the printed circuit board. Preferably, a prefabricated blank of an electrically conductive sheetlike element is used, so that the electrically conductive sheetlike element need not be cut individually and the productivity of the method can be increased still further.

Substep C2 provides a counter bearing in the form of the first electrode for the contact pressure applied subsequently by the second electrode.

Substep C3 is advantageous as regards the precise positioning of the second electrode relative to the respective connector section via which the conductor element is to be connected to the electrically conductive sheetlike element.

Substeps C4 to C8 are advantageous as regards establishing a connection between the conductor element and the electrically conductive sheetlike element by means of resistance welding.

It may, however, also be of advantage when step D comprises at least one of the following substeps:

Substep D1: removing the conductor element from the mold.

Substep D2: arranging insulating material on the second side of the electrically conductive sheetlike element, which second side is connected to the conductor element, preferably on the second side of the insulating-material sheetlike element arranged on the second side of the electrically conductive sheetlike element, preferably as a mass or in the form of an insulating-material sheetlike element, particularly preferred such that the insulating material fully encompasses the conductor element with the exception of the positions of the intended connection points.

Substep D3: applying pressure and, possibly, heat to the insulating material in the direction of the electrically conductive sheetlike element, so that the insulating material will adapt to the contour of the conductor element and, possibly, connect to an already existing insulating material.

Substep D4: smoothing the insulating material on the side facing away from the electrically conductive sheetlike element, so as to form a planar lower side of the printed circuit board.

Substep D5: hardening the insulating material.

Substep D1 makes the conductor element accessible for the subsequent application of the insulating material. After the connection between the conductor element and the electrically conductive sheetlike element has been established, the relative position and orientation of these elements is fixed, so that the mold is now no longer necessary and can be removed.

Substep D2 embeds the conductive element almost completely into insulating material. Preferably, a prefabricated insulating-material sheetlike element is used, so that individual application of the insulating material can be dispensed with and the productivity of the method can be increased still further. The insulating-material sheetlike element may have a suitable reception means for each conductor element.

Substeps D3 and D4 are preferably carried out in a press under the influence of pressure and temperature.

It may prove to be useful, when step E comprises at least one of the following substeps:

Substep E0: applying at least one contacting point, which connects the conductor element to the electrically conductive sheetlike element at least electrically.

Substep E1: working out the connection points by locally removing surrounding sections of the electrically conductive sheetlike element, preferably by means of etching.

Substep E2: working out at least one conductor path by locally removing surrounding sections of the electrically conductive sheetlike element, preferably by means of etching.

Substep E0 allows an additional electrical connection of the conductor elements to the electrically conductive sheetlike element, from which conductor patterns are produced in substeps E1 and E2, and/or to external components. The connection points can thus be used as a purely mechanical connection.

Substeps E1 and E2 allow the production of complex conductor patterns on the surface of the printed circuit board in addition to the conductor elements extending in the latter between connection points. Preferably, the connection points and/or the conductor paths are worked out depending on a previously produced reference marking.

A further aspect of the present invention relates to a printed circuit board produced by the method according to one of the aspects 1 to 6. The above mentioned advantages apply.

Yet another aspect of the present invention relates to a mold for producing a printed circuit board, preferably a printed circuit board according to aspect 7, preferably by the method according to one of the aspects 1 to 6, the mold comprising at least one receptacle for a conductor element in a first side of the mold and at least one opening in a second side of the mold, the opening communicating with the receptacle and being used for inserting a connection tool. The above mentioned advantages apply.

A still further aspect of the present invention relates to a kit for producing a printed circuit board, preferably a printed circuit board according to aspect 7, preferably by the method according to one of the aspects 1 to 6, the kit comprising a mold according to aspect 8, at least one conductor element adapted to be arranged in the receptacle, and at least one connection tool adapted to be inserted into the opening. The kit comprises components and tools, which are adapted to one another and used for producing the printed circuit board.

Terms and Definitions

Mold

A mold within the meaning of the present invention is an aid used for producing the printed circuit board. To this end, the mold includes at least one receptacle for a conductor element.

The mold may have at least one of the following features:

The mold consists of a dielectric or electrically insulating material, e.g. a composite material consisting of epoxy resin and a glass fiber fabric.

The mold is configured as a plate.

The mold extends substantially in one plane.

The mold comprises an upper side, which is preferably planar.

The mold comprises a lower side, which is preferably planar.

The upper side and the lower side of the mold are parallel to each other.

The mold has a thickness of 1 to 5 mm, preferably 1.5 to 3 mm, more preferred 2 mm.

The mold has a polygonal, preferably rectangular or square outline.

The receptacle of the mold has an inner contour that matches the outer contour of the conductor element.

The receptacle of the mold has an outer contour that matches the inner contour of the conductor element.

The depth of the receptacle is adapted to height/thickness of the conductor element.

The mold has a separate receptacle for each conductor element.

The receptacle extends from a first side of the mold into the mold.

The receptacle is incorporated into the mold from a first side of the mold, preferably by milling.

The first side of the mold defines the upper side of the mold.

The depth of the receptacle is in the range of from 50 to 1000 µm, preferably in the range of from 100 to 500 µm, more preferred in the range of from 300 to 400 µm, particularly preferred 350 µm.

The mold has at least one opening, which is configured as a passage and which communicates with the receptacle, the opening being used for inserting a tool from the second side of the mold.

The passage extends substantially perpendicular to the plane in which the mold extends.

The passage extends from the second side of the mold into the respective receptacle.

Each receptacle has associated therewith at least one opening configured as a passage, preferably two openings configured as respective passages and preferably arranged at different ends of the receptacle.

Printed Circuit Board

A printed circuit board within the meaning of the present invention is a carrier for electronic components. The printed circuit board is used e.g. for mechanically fastening and electrically connecting the electronic components. Almost every electronic device comprises one or a plurality of printed circuit boards. A printed circuit board may also be referred to as circuit board, board or printed circuit and corresponds to what is known in English as Printed Circuit Board (PCB).

The printed circuit board preferably has at least one of the following features:

The printed circuit board comprises one layer or a plurality of layers, preferably a plurality of identical layers.

The printed circuit board is a printed circuit board according to EP 1 842 402 A2.

The printed circuit board is a printed circuit board according to DE 10 2011 102 484 A1.

The printed circuit board is a printed circuit board according to DE 10 2013 223 143 A1.

The printed circuit board extends in one plane.

The printed circuit board has parallel upper and lower sides.

On the upper side of the printed circuit board there are at least two connection points.

On the upper side of the printed circuit board there is at least one conductor path.

The printed circuit board has embedded therein at least one conductor element, the conductor element, with the exception of the connection points, being embedded in insulating material.

Conductor Element

A conductor element within the meaning of the present invention is an object for transporting electrical energy and/or heat and/or for transmitting signals in the fields of wire-bound communications engineering and wire-bound high-frequency engineering. The conductor element may be part of an electrical circuit or power supply system and thus connect the power source and the consumer. For transport, electrons flow through the conductor element as a conductor current. For a low voltage drop and low transport losses, respectively, the conductive material should have a high electrical conductivity, for which some metals are particularly suitable. The cross-sectional area of the conductor is preferably configured for the permissible current density.

The conductor element preferably has at least one of the following features:

The conductor element is a conductor wire, preferably a round wire with a round cross-section or a rectangular wire with a rectangular cross-section, the conductor wire being preferably constant in cross-section throughout its length. The conductor element is preferably a conductor wire according to EP 1 842 402 A2.

The conductor element is a shaped part, preferably a shaped part according to DE 10 2011 102 484 A1. The shaped part may have e.g. the following features:

The shaped part extends substantially in one plane.

The shaped part is made of metal, preferably of copper.

The shaped part comprises, at least sectionwise, a concave contour and/or, at least sectionwise, a convex contour.

The shaped part is, at least sectionwise, preferably fully, embedded in the printed circuit board.

The upper sides of the printed circuit board and of the shaped part are oriented substantially parallel to each other.

The shaped part is separated from a platelike workpiece, preferably by punching, eroding, cutting, and more preferred by water jet cutting.

The shaped part has a thickness in the range of from 10 to 2000 µm, preferably in the range of from 100 to 1000 µm, more preferred in the range of from 200 to 500 µm.

A length and/or width of the shaped part is at least five times, preferably at least ten times, more preferred at least twenty times, even more preferred at least fifty times or most preferred at least one hundred times the thickness of the shaped part and/or the thickness of the printed circuit board.

The shaped part has a substantially rectangular cross-section.

The cross-sectional shape of the shaped part is not constant over the width and/or over the length of the shaped part.

The thickness of the shaped part is constant over its entire area.

The shaped part has a curvature in one, two, three or more planes of curvature.

The shaped part protrudes, at least sectionwise, from the insulating material.

The shaped part is not producible or produced in an extrusion process.

The shaped part comprises at least one recess, which is incorporated into the shaped part starting from one edge side of the shaped part. The recess is preferably filled with insulating material, at least sectionwise.

The shaped part comprises at least one opening, which extends into the shaped part sectionwise from the upper side, the lower side or an edge side of the shaped part, the opening having, preferably at least in the area of its mouth, a circular, oval, polygonal, preferably triangular, quadrangular, pentagonal, more preferred a rectangular or square outline, the opening being preferably substantially groove-shaped and extending continuously or discontinuously along a straight or a curved line, this line extending particularly preferred, at least sectionwise, parallel to an edge side of the shaped part, and the opening being, particularly preferred, filled with insulating material, at least sectionwise.

The shaped part comprises at least one aperture, which extends through the shaped part transversely, preferably perpendicularly, to the upper side, the lower side or an edge side of the shaped part, the aperture having preferably a circular, oval, polygonal, more preferred a triangular, quadrangular, pentagonal, rectangular or square outline, the aperture being preferably substantially slot-shaped and extending continuously or discontinuously along a straight or a curved line, this line extending, particularly preferred, at least sectionwise parallel to an edge side of the shaped part, the aperture being, particularly preferred, filled with insulating material, at least sectionwise.

The shaped part is essentially L-shaped, T-shaped, H-shaped, S-shaped, O-shaped, E-shaped, F-shaped, X-shaped, Y-shaped, Z-shaped, C-shaped, U-shaped or Ω-shaped.

A plurality of shaped parts is arranged in the same plane or in different planes, preferably in parallel planes within the circuit board.

The conductor element is a resistor, preferably a precision resistor, more preferred a precision resistor according to DE 10 2013 223 143 A1. The precision resistor may have the following features:

The precision resistor has a resistance value in the range of from 0.1 to 300 mOhm, preferably in the range of from 1 to 100 mOhm.

The precision resistor has a variance of less than +/−5%, preferably a variance of less than +/−2%, more preferred a variance of +/−1% or less.

The temperature coefficient of the electrical resistance of the precision resistor for the temperature range between 20 and 60° C. is in the range of from 0.1 ppm/K to 200 ppm/K, preferably in the range of from 0.5 ppm/K to 100 ppm/K, more preferred in the range of from 1 ppm/K to 50 ppm/K.

The precision resistor consists of metal, preferably of at least one of the elements copper (Cu), manganese (Mn), nickel (Ni), chromium (Cr), aluminum (Al), silicon (Si) or tin (Sn), more preferred of an alloy containing at least one of the elements copper (Cu), manganese (Mn), nickel (Ni), chromium (Cr), aluminum (Al), silicon (Si) or tin (Sn), for example of Manganin, Zeranin or Isaohm.

The conductor element contacts the connection points.

The conductor element is connected to at least one of the connection points, preferably to all the connection points, in an electrically conductive and/or mechanical manner.

The conductor element is welded to the connection points.

The conductor element is, at least predominantly, preferably completely, embedded in the printed circuit board.

An upper side and/or a lower side and/or at least one of the edge sides of the conductor element, preferably all the edge sides of the conductor element, is/are covered with insulating material, at least sectionwise, preferably completely.

An upper side and/or a lower side and/or at least one of the edge sides of the conductor element extend, at least sectionwise, preferably completely, flush with an upper side and/or a lower side and/or at least one of the edge sides of an adjoining layer of insulating material.

The upper sides and/or the lower sides and/or at least one of the respective edge sides of the printed circuit board and of the conductor element are oriented parallel to one another.

The upper sides and/or the bottom sides and/or at least one of the respective edge sides of the conductor element and of the electrically conductive sheetlike element are oriented parallel to one another.

The conductor element is producible or produced in an extrusion process.

The conductor element is configured as a flat wire.

The conductor element extends essentially in one plane.

The conductor element has a rectangular cross-section, and preferably the side of the cross-section having the larger dimensions is directed towards the surface of the printed circuit board.

The conductor element has a thickness in the range of from 10 to 2000 μm, preferably in the range of from 50 to 1000 μm, more preferred in the range of from 100 to 500 μm.

The conductor element comprises or consists of an electrically conductive material.

The conductor element comprises or consists of a composite or hybrid material, one section of this material being electrically conductive and the other one electrically insulating.

The conductor element comprises or consists of metal, preferably copper.

The conductor element comprises at least one connector section, preferably made of a material different from that of the conductor element, preferably hard solder, particularly preferred silver. The connector section is connected to the conductor element, preferably with a substance-to-substance bond, e.g. by welding. The connector section is configured e.g. in the form of platelets.

The conductor element includes an adhesive agent so as to improve the connection to the insulating material.

The conductor element comprises a roughened surface so as to improve the connection to the insulating material, preferably with the following features:

The surface of the conductor element is at least partially roughened before the conductor element comes into contact with insulating material, preferably before step B and/or before step C.

The surface of the conductor element is roughened by chemical etching, the chemical etching being carried out preferably by immersing the conductor element into a liquid which etches the material of the conductor element or by spraying such a liquid onto the conductor element.

The surface of the conductor element is roughened by mechanical processing, e.g. by sandblasting or by spraying pumice powder or quartz powder under high pressure onto this surface.

Insulating Material

An insulating material within the meaning of the present invention is a non-conductive material, i.e. a material having only an extremely low and therefore negligible electrical conductivity. Insulating materials are used in electrical engineering to limit the flow of electric current to the live parts. Insulating material is applied preferably in a plastic or flowable state and cured after having assumed the intended shape. Insulating material may be applied as a mass or as a prepreg mat, by way of example. The prepreg mat comprises a layer of fabric, which provides internal cohesion and already provides an existing basic structure, the layer of fabric being impregnated with a flowable or plastic resin and allowing thus an adaptation of shape.

Electrically Conductive Sheetlike Element or Foil

The electrically conductive sheetlike element within the meaning of the present invention is a planar element, such as a sheet, consisting of an electrically conductive material.

The electrically conductive sheetlike element preferably has at least one of the following features:

The electrically conductive sheetlike element comprises or consists of an electrically conductive material.

The electrically conductive sheetlike element comprises or consists of metal, preferably copper.

The electrically conductive sheetlike element is configured as a foil.

The electrically conductive sheetlike element has a thickness in the range of from 10 to 1000 μm, preferably in the range of from 15 to 200 μm, more preferred in the range of from 18 to 105 μm, particularly preferred of 35 μm.

Other preferred further developments of the present invention result from combinations of the features disclosed therein.

DETAILED DESCRIPTION OF THE PREFERRED EMBODIMENTS

The preferred first embodiment of the present invention will be described hereinafter in detail with reference to the enclosed drawings 1 to 5.

Figure 1A:
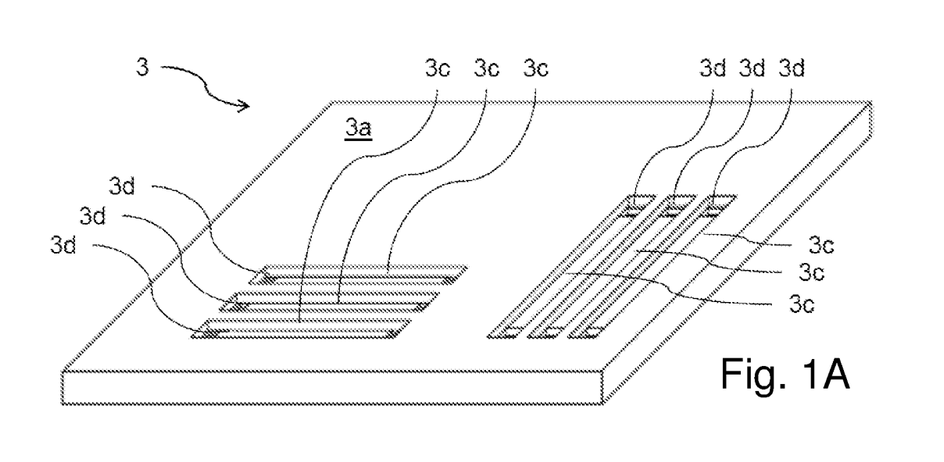
FIGS. 1A and 1B show in FIG. 1A a perspective representation of a mold comprising a plurality of receptacles for arranging conductor elements and in FIG. 1B a schematic sectional view showing one receptacle in a longitudinal section and one receptacle in a cross-section through a respective passage opening.

A mold 3 for producing a printed circuit board 1 is shown in a perspective representation in FIG. 1A. The mold comprises a total of six receptacles 3c for a total of six conductor elements 2 configured as rectangular wires. Each of the receptacles 3c comprises a substantially rectangular-shaped cavity, which opens towards a first side 3a of the mold 3, this side being referred to as upper side. Starting from a second side 3b of the mold, which is referred to as lower side, two openings 3d, configured as respective passages, extend into each of the receptacles 3c. The first and second sides 3a, 3b of the mold 3 face away from each other and extend in parallel planes. The mold 3 may have different receptacles 3c for differently configured conductor elements 2. These different receptacles 3c may be located on different sides 3a, 3b of the mold 3. The mold 3 is made e.g. of an electrically insulating material, for example FR4 (composite board consisting of epoxy resin and a glass fiber fabric). The receptacles 3c are produced by milling, starting from the first side 3a of the mold 3, by way of example. The openings 3d, which are configured as passages, are preferably produced, e.g. by drilling, when the receptacles 3c have been formed.

Figure 1B:
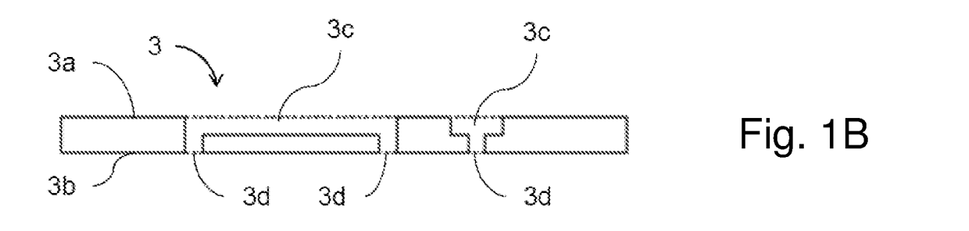

FIG. 1B shows a schematic and simplified sectional view of a mold 3 for manufacturing a printed circuit board 1 to describe the method according to the present invention. This mold 3 comprises only two receptacles 3c, which extend along different edges of the mold 3, the edges being arranged perpendicular to each other. It can be seen how the receptacles 3c open towards the first side 3a of the mold and how the openings 3d, which are configured as passages, terminate in the respective receptacle 3c from the second side 3b of the mold 3. The openings 3d may widen in a funnel shape towards the second side 3b of the mold 3, so that tools 6b can be inserted more easily.

Figure 2:
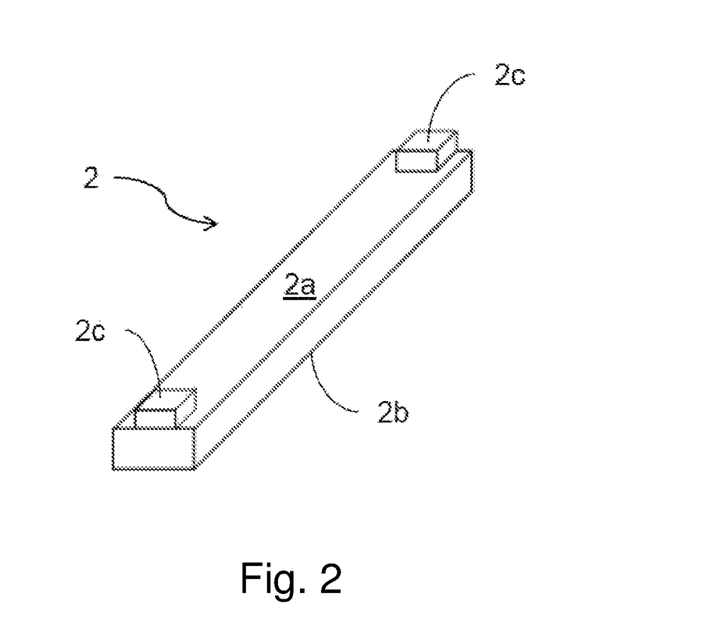
FIG. 2 shows a perspective view of a conductor element having connector sections applied to the respective ends of a surface thereof, the conductor element being configured as a conductor wire having a rectangular cross-sectional area.

FIG. 2 shows, in a perspective view, a conductor element 2, which is configured as a parallelepipedic conductor wire 2 with a rectangular cross-sectional area and which fits into each of the receptacles 3c of the mold shown in FIGS. 1A and 1B. The two largest surfaces of the parallelepipedic conductor element 2 define the upper side 2a and the lower side 2b of the conductor element 2. Rectangular or platelet-shaped connector sections 2c are applied, e.g. welded, to the upper side 2a of the conductor element 2 at opposite ends of the latter. In a condition of accommodation in the receptacle 3c, the upper side 2a of the conductor element 2 extends in one plane with the upper side 3a of the mold 3 and is flush therewith, the connector sections 2c projecting beyond the upper side 3a of the mold 3. Deviating from the representation in FIG. 2, the conductor element 2 may have a different shape. In particular, the conductor element 2 may e.g. also be a shaped part, a round wire or a precision resistor. In this case, the receptacle 3c will usually have to be adapted accordingly.

The method according to the present invention used for producing a printed circuit board 1, which comprises at least one conductor element 2 extending between connection points 1d in the printed circuit board 1, and described hereinafter in particular with reference to FIGS. 3A-3E comprises the following steps:

Step A: providing a mold 3 having at least one receptacle 3c for a conductor element 2.

Substep A1 comprises providing the mold 3 shown in FIG. 1B.

Figure 3A:
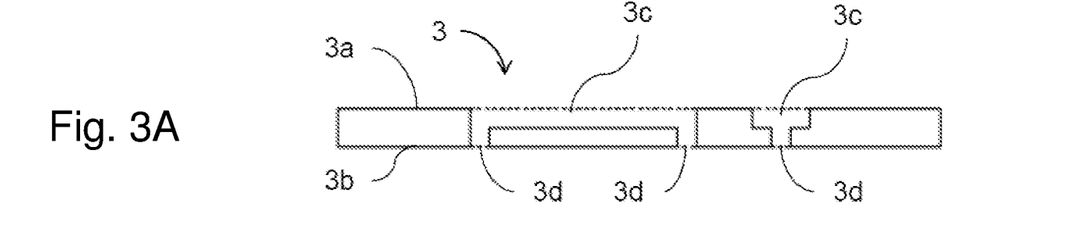
FIG. 3A shows the schematic sectional view of the mold shown in FIG. 1B.
Figure 3B:
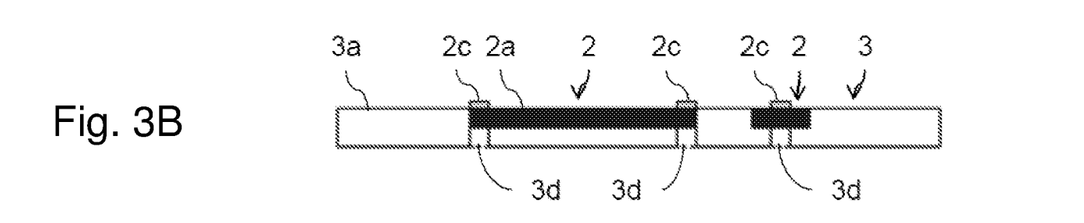
FIG. 3B shows, in a schematic sectional view, an arrangement comprising the mold shown in FIGS. 1B and 3A and two conductor elements shown in FIG. 2, the conductor elements being arranged in the receptacles of the mold, which are shown in a longitudinal section and in a cross-section, respectively, in such a way that the upper sides of the conductor elements are flush with the upper side of the mold and the connector sections projecting beyond the upper sides of the conductor elements project beyond the upper side of the mold.

As shown in FIG. 3B, the mold 3 is arranged such that the upper side (first side) 3a of the mold 3 extends in a horizontal plane (substep A2).

Step B: arranging a conductor element 2 in the receptacle 3c of the mold 3.

Substep B1 comprises providing conductor elements 2. In the present embodiment each conductor element 2 is configured as a parallelepipedic conductor wire 2 having connector sections 2c applied to the upper side at the respective ends thereof, as shown in FIG. 2.

As shown in FIG. 3B, each conductor element 2 is arranged in the receptacle 3c such that the conductor element 2 is oriented parallel to the plane in which the mold 3 extends and is accommodated in the receptacle 3c in an almost form-fit manner and without any play with respect to the plane in which the mold 3 extends (substep B2).

Subsequently, each conductor element 2 is inserted into the respective receptacle 3c such that the side 2a of the conductor element 2 provided with the connector sections 2c is substantially flush with the upper side (first side) 3a of the mold 3 and only the connector sections 2c project beyond the upper side (first side) 3a of the mold 3 (substep B3).

Figure 3C:
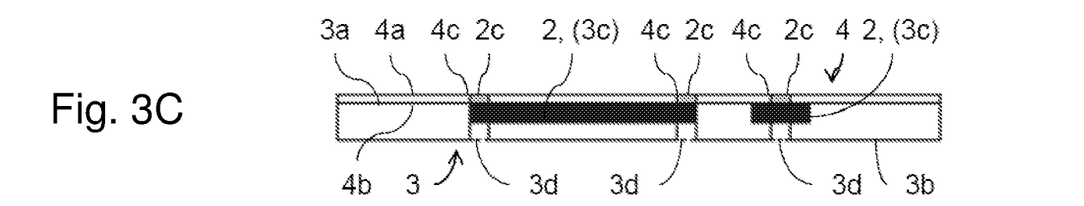
FIG. 3C shows the arrangement according to FIG. 3B, the upper side of the mold, beyond which the connector sections project, having arranged thereon an insulating-material sheetlike element in the form of a prepreg mat comprising a plurality of openings adapted to the positions and the shapes of the connector sections, so that the upper sides of the connector sections are arranged flush with the upper side of the insulating-material sheetlike element in one plane.

As shown in FIG. 3C, an insulating-material sheetlike element 4, which has openings 4c that are adapted to the positions and, possibly, shapes of the connector sections 2c, e.g. in the form of a prepreg mat provided with openings, may be arranged on the first side 3a of the mold 3. In this way, each conductor element, with the exception of the connector sections 2c, can be fully encompassed with insulating material and can thus be electrically decoupled from the surroundings completely. The lower side (second side) 4b of the insulating-material sheetlike element 4 rests, preferably areally, on the upper side (first side) 3a of the mold 3 as well as on the upper side (first side) 2a of the conductor element 2 accommodated in the receptacle 3c of the mold 3, the upper side of the connector sections 2c being flush with an upper side (first side) 4a of the insulating-material sheetlike element 4 (substep B4).

Step C: connecting the conductor element 2 arranged in the receptacle 3c of the mold 3 to an electrically conductive sheetlike element 5 at positions of the intended connection points 1d.

Figure 3D:
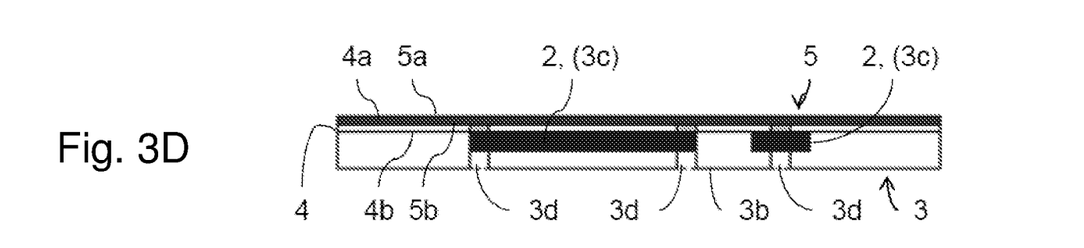
FIG. 3D shows the arrangement according to FIG. 3C, wherein the upper side of the insulating-material sheetlike element, which is arranged flush with the upper sides of the connector sections in one plane, has additionally arranged thereon an electrically conductive sheetlike element.

First, an electrically conductive sheetlike element 5, e.g. in the form of a copper foil, is arranged on the upper side (first side) 3a of the mold 3, so that it fully covers the upper side (first side) 4a of the insulating-material sheetlike element 4 and the connector sections 2c which are flush with the latter (substep C1). By pressing the electrically conductive sheetlike element 5 against the upper side (first side) 4a of the insulating-material sheetlike element 4, air inclusions can be eliminated.

Subsequently, electrically conductive connections between the conductor element 2 and the electrically conductive sheetlike element 5 are established via the connector sections 2c at the positions of the intended connection points 1d. This is done e.g. by welding, in particular resistance welding, ultrasonic welding, or by brazing or the like.

Figure 3E:
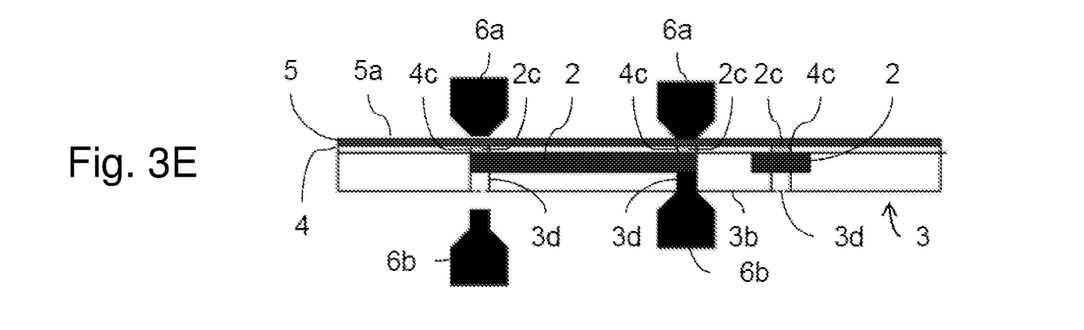
FIG. 3E shows an arrangement according to FIG. 3D, wherein each connector section of a conductor element to be connected has arranged thereon two respective contact electrodes for establishing an electrically conductive connection between a conductor element and the electrically conductive sheetlike element on different sides of the mold, the respective contact electrode provided on the lower side extending through the opening, which is configured as a passage and provided in the lower side of the mold, up to the conductor element accommodated in the respective receptacle, so that the contact electrode in question can directly contact the conductor element to be connected.

In an exemplarily described resistance welding process, a first electrode 6a of a resistance welding tool is arranged on the upper side (first side) 3a of the mold 3, so that the first electrode 6a is in contact with the upper side (first side) 5a of the electrically conductive sheetlike element 5. The position of the first electrode 6a is here adapted to the position of an intended connection point 1d and the position of a connector section 2c, respectively, (substep C2).

Subsequently, a second electrode 6b of the connection tool is arranged on the lower side (second side) 3b of the mold 3 such that the second electrode 6b penetrates an opening 3d in the lower side (second side) 3b of the mold 3 and is in contact with the second side 2b of the conductor element 2 (substep C3).

Following this, a contact pressure is applied between the first electrode 6a and the second electrode 6b (substep C4) and an electric current is applied therebetween (substep C5), the electric current causing the respective connector section 2c to be heated. Each connector section 2c is here heated until the necessary working temperature has been reached, so that the conductor element 2 and the electrically conductive sheetlike element 5 will be connected inseparably by welding via the connector section 2c under the action of a force and by melting/solidifying the material of the connector section 2c, by diffusion or in solid phase, (substep C6).

Subsequently, the electrodes 6a, 6b are removed (substeps C7 and C8).

Step D: embedding the conductor element 2, which is connected to the electrically conductive sheetlike element 5, into insulating material 4, 7.

First, the conductor element 2 is removed from the mold 3 (substep (D1).

Following this, insulating material 7 is arranged, in a moldable state, in the form of an insulating-material sheetlike element 7, such as a prepreg mat, on the lower side (second side) 5b of the electrically conductive sheetlike element 5, this lower side being connected to the conductor element 2. In so doing, the insulating material 7 is preferably connected to the lower side (second side) 4b of the insulating-material sheetlike element 4, which has already been arranged on the lower side (second side) 5b of the electrically conductive sheetlike element 5. However, the insulating material 7 may also be applied as a flowable mass. The insulating material 7 is preferably applied in such a way that it fully encompasses the conductor element 2, with the exception of the positions of the intended connection points 1c, (substep D2), and thus embeds the conductor element 2 almost completely.

The optional application of pressure and, possibly, heat to the insulating material 4, 7 in the direction of the electrically conductive sheetlike element 5 can cause the insulating material 4, 7 to surround the conductor element 2 close to the contour of the latter (substep D3). If an insulating-material sheetlike element 4 is already present between the conductor element 2 and the electrically conductive sheetlike element 5, the application of pressure and, possibly, heat to the subsequently applied insulating-material sheetlike element 7 can improve a connection between the two insulating-material sheetlike elements 4, 7.

This is done, for example, in a press. In so doing, the insulating material 4, 7 is smoothed on the side facing away from the electrically conductive sheetlike element 5, so as to form a planar lower side 1b of the printed circuit board 1 (substep D4), and hardened (substep D5).

Step E: working out the connection points 1d from the electrically conductive sheetlike element 5.

When step D has been completed, the surface of the printed circuit board 1 is fully covered by the electrically conductive sheetlike element 5, with the conductor element 2 extending inside the printed circuit board 1 and being embedded in insulating material 4, 7.

At the positions of the intended connection points 1d, at which the conductor element 2 is connected via the connector sections 2c to the electrically conductive sheetlike element 5, the connection points 1c are now worked out by locally removing surrounding sections of the electrically conductive sheetlike element 5 (substep E1). This is preferably accomplished by etching.

For the purpose of signal transmission, by way of example, also conductor paths can be worked out by locally removing surrounding sections of the electrically conductive sheetlike element 5. Also this is preferably accomplished by etching (substep E2). A conductor path 1e is preferably connected to at least one connection point 1d in an electrically conductive manner.

Figure 4A:
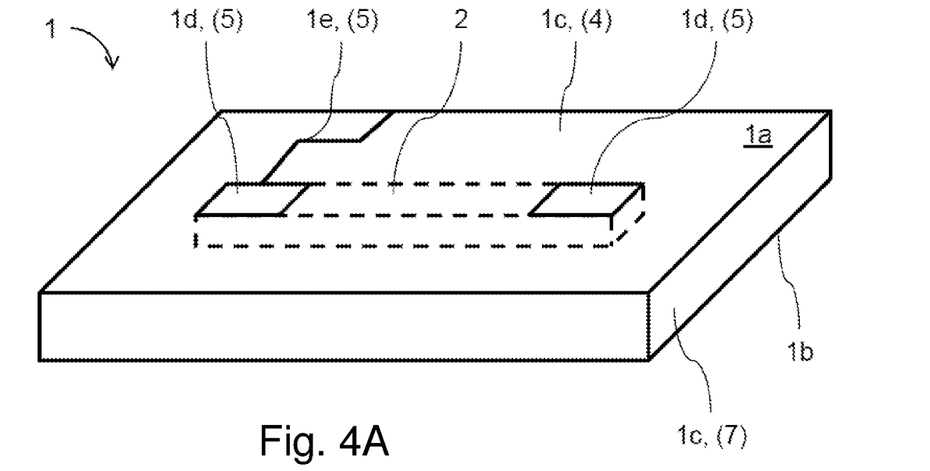
FIGS. 4A and 4B show in FIG. 4A a perspective view and in FIG. 4B a schematic sectional view of a printed circuit board produced according to the method disclosed by the present invention.
Figure 4B:
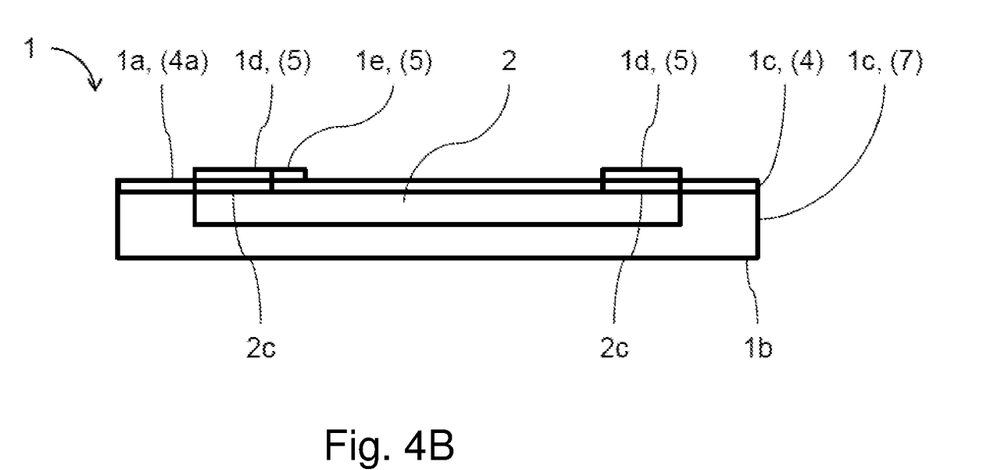
Figure 5:
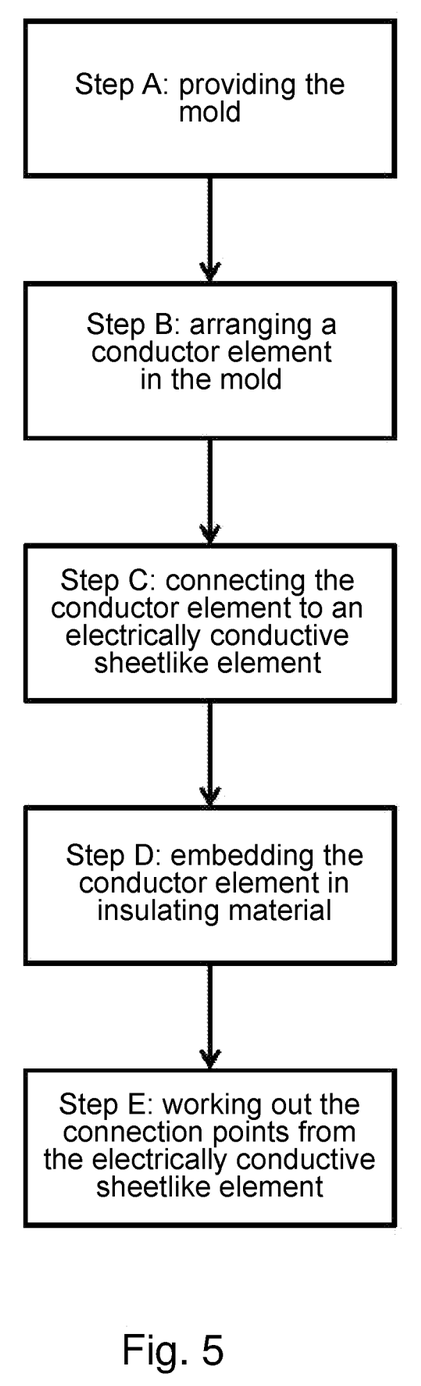
FIG. 5 shows a flowchart of the method according to the present invention used for producing a printed circuit board.

FIGS. 4A and 4B show a printed circuit board 1, which has been produced making use of the mold 3 shown in FIGS.

1A and 1B, in a perspective view (FIG. 4A) as well as in a schematic sectional view (FIG. 4B). The printed circuit board 1 has a substantially rectangular outline and a parallelepipedic shape. The parallelepipedic conductor element 2 extends between two connection points 1*d*, which are arranged on the upper side 1*a* of the printed circuit board 1 and which have been worked out from a copper foil (5) e.g. by etching, and is fully embedded in insulating material 1*d* (4, 7) with the exception of the positions of the connection points 1*d*.

In the schematic sectional view according to FIG. 4B, the structural design of the printed circuit board 1 is clearly visible. The upper side 1*a* of the printed circuit board 1 is defined by the first insulating-material sheetlike element 4, which has been applied to the upper side of the mold 3 in step B (substep B4). The lower side 1*b* of the printed circuit board 1 is defined by the second insulating-material sheetlike element 7, which, for embedding the conductor element almost completely in insulating material 1*c*, has been applied to the lower side of the first insulating-material sheetlike element 4 only after a connection has been established between the conductor element 2 and the electrically conductive sheetlike element 5 via the connector sections 2*c*. The connection points 1*d* and conductor paths 1*e* arranged on the upper side 1*a* of the printed circuit board 1 are made of the material of the electrically conductive sheetlike element (5), which has been arranged on the upper side of the first insulating-material sheetlike element 4 in step C (substep C1).

In the following, a further embodiment will be described in detail making reference to the enclosed FIGS. 6A and 6B.

Figure 6A:
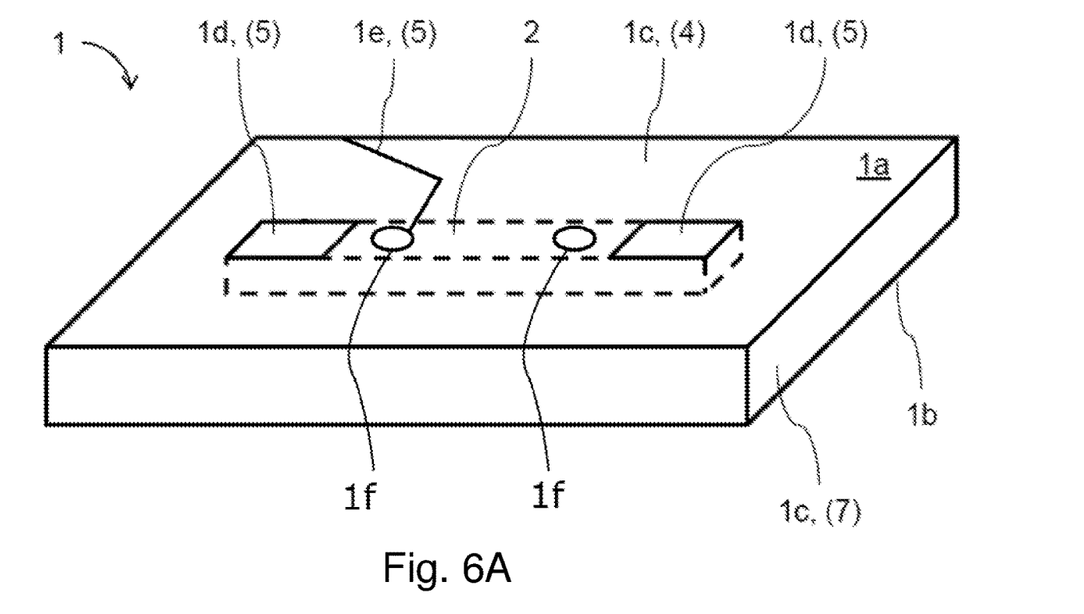
FIGS. 6A and 6B show in FIG. 6A a perspective view and in FIG. 6B a schematic sectional view of a further embodiment of a printed circuit board produced according to the method disclosed by the present invention.
Figure 6B:
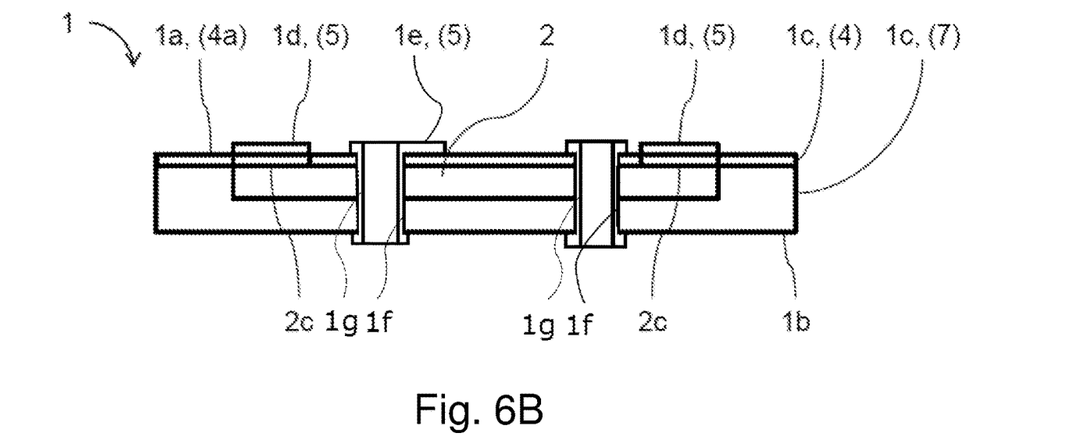

Also FIGS. 6A and 6B show a printed circuit board 1, which has been produced making use of the mold 3 shown in FIGS. 1A and 1B, in a perspective view (FIG. 6A) as well as in a schematic sectional view (FIG. 6B). The printed circuit board 1 has substantially the same structural design as the printed circuit board 1 according to the first embodiment. Hence, identical features are provided with like reference numerals. The printed circuit board 1 according to the second embodiment has again a rectangular outline and a parallelepipedic shape. Also in the case of the second embodiment, the parallelepipedic conductor element 2 extends between two connection points 1*d*, which are arranged on the upper side 1*a* of the printed circuit board 1.

In contrast to the first embodiment, where the connection points 1*d* provide a mechanical and an electrical connection of the electrically conductive sheetlike element 5 to the conductor element 2, the connection points 1*d* in the second embodiment provide a substantially purely mechanical connection. The connection points 1*d* thus have the function of structurally connecting the electrically conductive sheetlike element 5 to the conductor element 2, in particular while the conductor element 2, which is connected to the electrically conductive sheetlike element 5, is being embedded into insulating material 4, 7 (step D). The electrically conductive sheetlike element 5 is a very thin element and can therefore be deformed very easily. Due to the fact that the electrically conductive sheetlike element 5 is connected to the conductor element 2 via the connection points 1*d*, a deformation and/or displacement of the electrically conductive sheetlike element 5 during e.g. the pressing process for applying the insulating material 4, 7 (step D) can be reduced, preferably prevented. In this way a high manufacturing precision can be accomplished.

It follows that the connection between the electrically conductive sheetlike element 5 and the conductor element 2 (step C) need not necessarily be of an electrical nature. For example, the connector section 2*c* may also consist of a non-electrically conductive connecting material. The connecting material is preferably weldable, so as to achieve a substance-to-substance bond. In the case of a non-electrically conductive material, the connection may be established e.g. by pressure welding.

Also in the case of the second embodiment, the connection points 1*d* are worked out (step E) from the electrically conductive sheetlike element 5 after the pressing process in step D, i.e. after the application of the mechanical loads. In so doing, the connection points 1*d* are at least electrically insulated against conductor paths 1*e* from the electrically conductive sheetlike element 5, as shown in FIGS. 6A and 6B. Therefore, the connection points 1*d* are no longer electrically connected to the conductor paths 1*e* in the finished printed circuit board 1, as in the case of the first embodiment. It is also imaginable to etch away the connection points 1*d* completely, since they no longer have an electrical function, but only serve as a mechanical support during pressing in step D. The electrical connection between the conductor paths 1*e* and the conductor elements 2 and possible external components is established via contacting points 1*f*, 1*g*, which are introduced in a separate method step. These contacting points 1*f*, 1*g* may be formed e.g. by through-hole plating, in the case of which a hole 1*f* provided on its inner circumference with an electrically conductive layer 1*g*, preferably of metal, more preferred of copper, establishes the contact between the conductor element 2 and the conductor paths 1*e*, as shown in FIGS. 6A and 6B. The hole 1*f* may e.g. be copper-plated along its inner surface up to a conductor path 1*e* on one side and a conductor element 2 on the other side, so as to ensure an electrical connection between the conductor path 1*e* and the conductor element 2. The contacting points 1*f* with 1*g* may be applied in a step E0, in which the holes 1*f* are applied in a condition where the complete electrically conductive sheetlike element 5 is connected to conductor elements 2 at the intended connection points 1*d*. It follows that the mechanical loads during the application of the contacting points 1*f* with 1*g* can be taken up via the intended connection points 1*d* and a high manufacturing precision can be accomplished. Only afterwards, the connection points 1*d* are worked out as described above. Preferably, the contacting points 1*f* with 1*g* are applied in the vicinity of the intended connection points 1*d*.

Furthermore, the conductor element 2 may comprise a hybrid or composite material, which is electrically conductive in a section between contacting points 1*f* with 1*g* and electrically insulating in the section between a contacting point 1*f* with 1*g* and an intended connection point 1*d*. In this way dark currents can be prevented.

For providing a stable mechanical support, the printed circuit board 1 has preferably provided thereon at least three connection points 1*d*, which preferably span an area in which the center of area of the electrically conductive sheetlike element 5 is located. In this way it can be ensured that the electrically conductive sheetlike element 5 is reliably held in position.

By means of the separation of functions, according to which the intended connection points 1*d* ensure a purely mechanical connection during e.g. pressing, and the contacting points 1*f* with 1*g* ensure the electrical connection, the contacting points 1*f* with 1*g* can be prevented from being impaired by possible defects at the connection points 1*d*.

The first embodiment and the second embodiment can be combined with each other. Individual connection points 1*d* of a printed circuit board 1 may thus be etched away completely or electrically insulated, and additional contacting points 1*f* with 1*g* may be provided for establishing an electrical connection between conductor paths 1*e* and conductor elements 2 and, possibly, external components, and other connection points 1*d* of a printed circuit board 1 may electrically connect conductor paths 1*e* and conductor elements 2, as in the case of the first embodiment.

The invention claimed is:

1. A method for producing a printed circuit board including at least one conductor element, which extends between connection points in the printed circuit board, the method comprising:
    a step A of providing a mold having at least one receptacle for the conductor element;
    a step B of arranging the conductor element in the receptacle of the mold;
    a step C of connecting the conductor element arranged in the receptacle of the mold to an electrically conductive sheetlike element at positions of the connection points;
    a step D of removing the conductor element connected to the electrically conductive sheetlike element from the mold, and embedding the conductor element connected to the electrically conductive sheetlike element into an insulating material; and
    a step E of working out the connection points from the electrically conductive sheetlike element.

2. The method according to claim 1, wherein the step A comprises at least one of:
    a substep A1 of providing the mold having a planar first side and at least one receptacle for the conductor element, the receptacle opening towards the first side of the mold; and
    a substep A2 of arranging the mold such that the first side of the mold extends, at least sectionwise or completely, in a horizontal plane.

3. The method according to claim 1, wherein the step B comprises at least one of:
    a substep B1 of providing the conductor element having at least two connector sections, which are arranged on and/or attached to a same side and/or different ends of the conductor element;
    a substep B2 of arranging the conductor element in the receptacle such that, relative to a plane in which the mold extends, the conductor element is accommodated in the receptacle in a form-fit manner and/or without any play, the conductor element being oriented parallel to the plane in which the mold extends;
    a substep B3 of arranging the conductor element in the receptacle such that the side of the conductor element provided with the connector sections is flush with the first side of the mold and the connector sections project beyond the first side of the mold; and
    a substep B4 of arranging insulating material, of an insulating-material sheetlike element, which has openings that are adapted to the positions and shapes of the connector sections, on the first side of the mold such that a second side of the insulating-material sheetlike element rests areally on the first side of the mold as well as on the first side of the conductor element accommodated in the receptacle of the mold, with the upper side of the connector sections being flush with a first side of the insulating-material sheetlike element.

4. The method according to claim 1, wherein the step C comprises at least one of:
    a substep C0 of connecting the conductor element arranged in the receptacle of the mold to the electrically conductive sheetlike element via at least one connector section consisting of a non-electrically conductive, weldable material, by pressure welding;
    a substep C1 of arranging an electrically conductive sheetlike element on the first side of the mold, on the first side of the insulating-material sheetlike element, such that the electrically conductive sheetlike element rests areally on the first side of the insulating-material sheetlike element and/or areally on the connector sections;
    a substep C2 of arranging a first electrode of a connection tool, which is used for establishing an electrically conductive connection between the conductor element and the electrically conductive sheetlike element, on a first side of the mold, such that the first electrode is in contact with the first side of the electrically conductive sheetlike element;
    a substep C3 of arranging a second electrode of the connection tool, which is used for establishing an electrically conductive connection between the conductor element and the electrically conductive sheetlike element, on a second side of the mold, such that the second electrode penetrates an opening in the mold and is in contact with the second side of the conductor element;
    a substep C4 of applying a contact pressure between the first electrode and the second electrode;
    a substep C5 of applying an electric current between the first electrode and the second electrode;
    a substep C6 of heating the connector section until a desired working temperature has been reached, so that the conductor element and the electrically conductive sheetlike element will be connected inseparably via the connector section, under action of a force between the electrodes, by melting and solidifying the material of the connector section, by diffusion or in solid phase, by welding;
    a substep C7 of removing the first electrode from the first side of the electrically conductive sheetlike element;
    a substep C8 of removing the second electrode from the second side of the conductor element and removing the second electrode from the opening in the mold; and
    a substep C9 of applying at least one reference mark to the electrically conductive sheetlike element, by producing at least one opening.

5. The method according to claim 1, wherein the step D comprises at least one of:
    a substep D2 of arranging insulating material on the second side of the electrically conductive sheetlike element, the second side being connected to the conductor element, on the second side of the insulating-material sheetlike element arranged on the second side of the electrically conductive sheetlike element, as a mass or in an insulating-material sheetlike element form, such that the insulating material fully encompasses the conductor element with the exception of each position of the intended connection points;
    a substep D3 of applying pressure and heat to the insulating material in a direction of the electrically conductive sheetlike element, so that the insulating material adapts to the contour of the conductor element and connect to an already existing insulating material;
    a substep D4 of smoothing the insulating material on the side facing away from the electrically conductive sheetlike element, so as to form a planar lower side of the printed circuit board; and
    a substep D5 of hardening the insulating material.

6. The method according to claim 1, wherein the step E comprises at least one of:
- a substep E0 of applying at least one contacting point, which connects the conductor element to the electrically conductive sheetlike element at least electrically;
- a substep E1 of working out the connection points by locally removing surrounding sections of the electrically conductive sheetlike element by etching; and
- a substep E2 of working out conductor paths by locally removing surrounding sections of the electrically conductive sheetlike element by etching.

* * * * *